US012812928B2

(12) United States Patent
Kang et al.

(10) Patent No.: US 12,812,928 B2
(45) Date of Patent: Nov. 24, 2026

(54) INTEGRATED CIRCUIT DEVICE

(71) Applicant: Samsung Electronics Co., Ltd., Suwon-si (KR)

(72) Inventors: Duckseoung Kang, Suwon-si (KR); Sangdeok Kwon, Suwon-si (KR); Gibum Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 403 days.

(21) Appl. No.: 18/532,576

(22) Filed: Dec. 7, 2023

(65) Prior Publication Data

US 2024/0387624 A1 Nov. 21, 2024

(30) Foreign Application Priority Data

May 15, 2023 (KR) ........................ 10-2023-0062702

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/13*** | (2025.01) |

(Continued)

(52) U.S. Cl.

CPC ......... *H10D 62/118* (2025.01); *H10D 30/014* (2025.01); *H10D 30/43* (2025.01); *H10D 30/6735* (2025.01); *H10D 30/6757* (2025.01); *H10D 62/115* (2025.01); *H10D 62/151* (2025.01); *H10D 64/017* (2025.01); *H10D 84/83* (2025.01)

(58) Field of Classification Search

CPC .. H10D 62/118; H10D 62/115; H10D 62/151; H10D 62/121; H10D 30/014; H10D 30/43; H10D 30/6735; H10D 30/6757; H10D 84/83; H10D 84/0151; H10D 84/0188; H10D 84/038; H10D 84/853

See application file for complete search history.

(56) References Cited

U.S. PATENT DOCUMENTS

| | | | |
|---|---|---|---|
| 9,406,676 | B2 | 8/2016 | Yu et al. |
| 9,865,704 | B2 | 1/2018 | Xie et al. |
| 10,388,519 | B2 | 8/2019 | Smith et al. |

(Continued)

FOREIGN PATENT DOCUMENTS

| | | |
|---|---|---|
| KR | 10-2325870 B1 | 11/2021 |

*Primary Examiner* — Marc-Anthony Armand

(74) *Attorney, Agent, or Firm* — HARNESS, DICKEY & PIERCE, P.L.C.

(57) ABSTRACT

An integrated circuit device includes a substrate including a first surface and a second surface that are opposite to each other, a fin type active area extending from the first surface of the substrate in a first direction, a channel structure on an upper surface of the fin type active area and including a channel region, a source/drain region on the upper surface of the fin type active area, a gate line extending on the substrate in a second direction that is perpendicular to the first direction, disposed on the substrate, and surrounding the channel structure, and an isolation structure passing vertically through the substrate and the fin type active area and located at one side of the source/drain region, wherein the channel structure, the source/drain region, and the isolation structure are sequentially arranged in the first direction.

20 Claims, 21 Drawing Sheets

(51) Int. Cl.
*H10D 64/01* (2025.01)
*H10D 84/83* (2025.01)

(56) References Cited

U.S. PATENT DOCUMENTS

| | | | | |
|---|---|---|---|---|
| 2020/0020570 | A1 | 1/2020 | Sung et al. | |
| 2022/0085007 | A1* | 3/2022 | Lee | H10D 30/0243 |
| 2022/0148912 | A1 | 5/2022 | Summerfelt et al. | |
| 2022/0231134 | A1 | 7/2022 | Hong et al. | |
| 2022/0262915 | A1 | 8/2022 | Su et al. | |
| 2022/0302172 | A1* | 9/2022 | Hong | H10D 30/014 |
| 2022/0328659 | A1* | 10/2022 | Kao | H10D 64/017 |
| 2022/0384250 | A1 | 12/2022 | Huang et al. | |
| 2022/0399335 | A1 | 12/2022 | Guler et al. | |
| 2023/0253477 | A1* | 8/2023 | Wang | H10D 84/0151 257/288 |

* cited by examiner

B1 - B1'

INTEGRATED CIRCUIT DEVICE

CROSS-REFERENCE TO RELATED APPLICATION

This application is based on and claims priority under 35 U.S.C. § 119 to Korean Patent Application No. 10-2023-0062702, filed on May 15, 2023, in the Korean Intellectual Property Office, the disclosure of which is incorporated by reference herein in its entirety.

BACKGROUND

Various example embodiments relate to an integrated circuit device, and in particular, to an integrated circuit device having a field-effect transistor.

As electronic technology has developed, demands or expectations for high-integration of an integrated circuit device are increasing and downscaling thereof is progressing. According to the downscaling of the integrated circuit device, a short channel effect of a transistor occurs and/or a reliability of the integrated circuit device degrades. In order to reduce the short channel effect, an integrated circuit device of a multi-gate structure such as a transistor of a nano-sheet type has been suggested.

SUMMARY

Various example embodiments may provide an integrated circuit device capable of improving inter-device isolation reliability.

According to some example embodiments, provided is an integrated circuit device including a substrate including a first surface and a second surface that are opposite to each other, a fin type active area extending from the first surface of the substrate in a first direction, a channel structure on an upper surface of the fin type active area and including a channel region, a source/drain region on the upper surface of the fin type active area, a gate line on the substrate, extending in a second direction that is perpendicular to the first direction, and surrounding the channel structure, and an isolation structure passing vertically through the substrate and the fin type active area and at one side of the source/drain region, wherein the channel structure, the source/drain region, and the isolation structure are sequentially arranged in the first direction.

Alternatively or additionally according to some example embodiments, provided is an integrated circuit device including a substrate including a first surface and a second surface that are opposite to each other, a first fin type active area extending from the first surface of the substrate in a first direction, a first channel structure and a second channel structure that are on an upper surface of the first fin type active area and are spaced apart from each other in the first direction, a first gate line on the substrate, extending in a second direction that is perpendicular to the first direction, and surrounding the first channel structure, a second gate line on the substrate, extending in the second direction, and surrounding the second channel structure, a third gate line between the first gate line and the second gate line in the first direction, a single diffusion break (SDB) structure passing vertically through the substrate and the first fin type active area, overlapping the third gate line in the vertical direction, and between the first channel structure and the second channel structure in the first direction, a first source/drain region disposed on the first fin type active area, and between the first channel structure and the SDB structure in the first direction, and a second source/drain region on the first fin type active area, and between the second channel structure and the SDB structure in the first direction.

Alternatively or additionally, provided is an integrated circuit device including a substrate including a first surface and a second surface that are opposite to each other, a first fin type active area extending from the first surface of the substrate in a first direction, a first channel structure on an upper surface of the first fin type active area and including a plurality of first nano-sheets spaced apart from each other in a vertical direction, a second channel structure on an upper surface of the first fin type active area and including a plurality of second nano-sheets spaced apart from each other in the vertical direction, a first gate line on the substrate, extending in a second direction that is perpendicular to the first direction and surrounding the plurality of first nano-sheets, a second gate line on the substrate, extending in the second direction and surrounding the plurality of second nano-sheets, a third gate line between the first gate line and the second gate line in the first direction, a single diffusion break (SDB) structure passing through the substrate and the first fin type active area in the vertical direction and being in contact with the third gate line, a first source/drain region on the first fin type active area, and between the first channel structure and the SDB structure in the first direction, a second source/drain region on the first fin type active area, and between the second channel structure and the SDB structure in the first direction, and a gate capping layer covering the SDB structure and the third gate line and including a same material as a material included in the SDB structure, wherein a lower surface of the SDB structure is coplanar with the second surface of the substrate.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Figure 1:
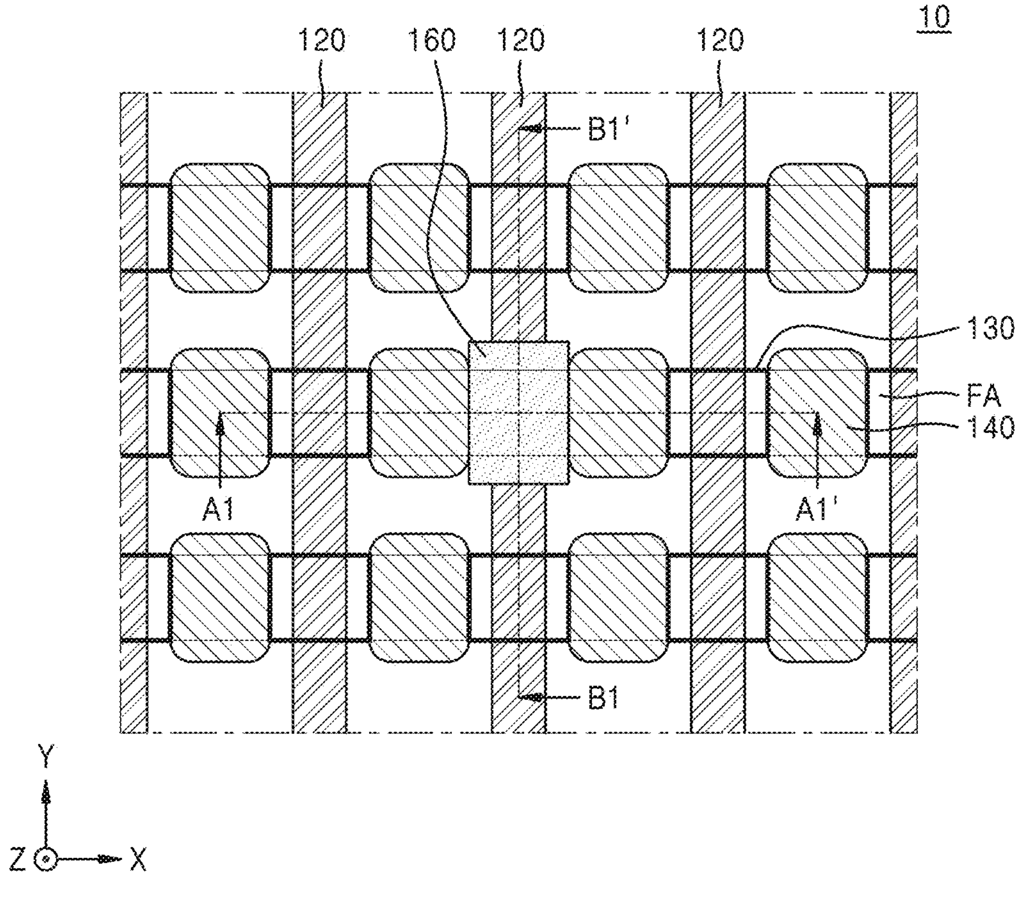
FIG. 1 is a diagram schematically showing a layout of an integrated circuit device according to some example embodiments.

Hereinafter, one or more embodiments of the inventive concept will be described in detail with reference to accompanying drawings. Like reference numerals denote the same elements on the drawings, and detailed descriptions thereof are omitted.

In the specification but not necessarily within the claims, a vertical direction may be defined as a Z-direction and a horizontal direction may be defined as a direction perpendicular to the Z-direction. A first horizontal direction and a second horizontal direction may be defined as directions crossing each other. The first horizontal direction may be referred to as an X-direction and the second horizontal direction may be referred to as a Y-direction. A horizontal width may denote a length according to a horizontal direction. A vertical level may denote a position according to a vertical direction, for example, a position according to the vertical direction measured based on a reference surface.

Figure 2:
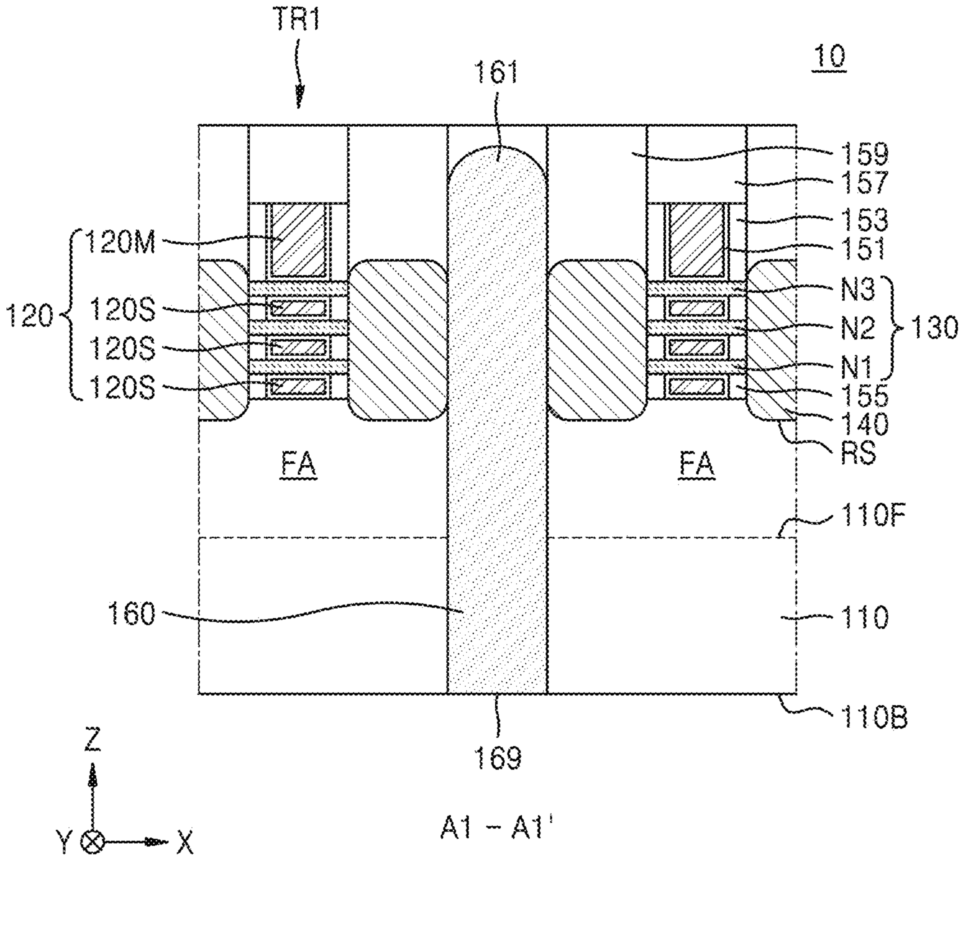
FIG. 2 is a cross-sectional view of the integrated circuit device taken along line A1-A1' of FIG. 1.
Figure 3:
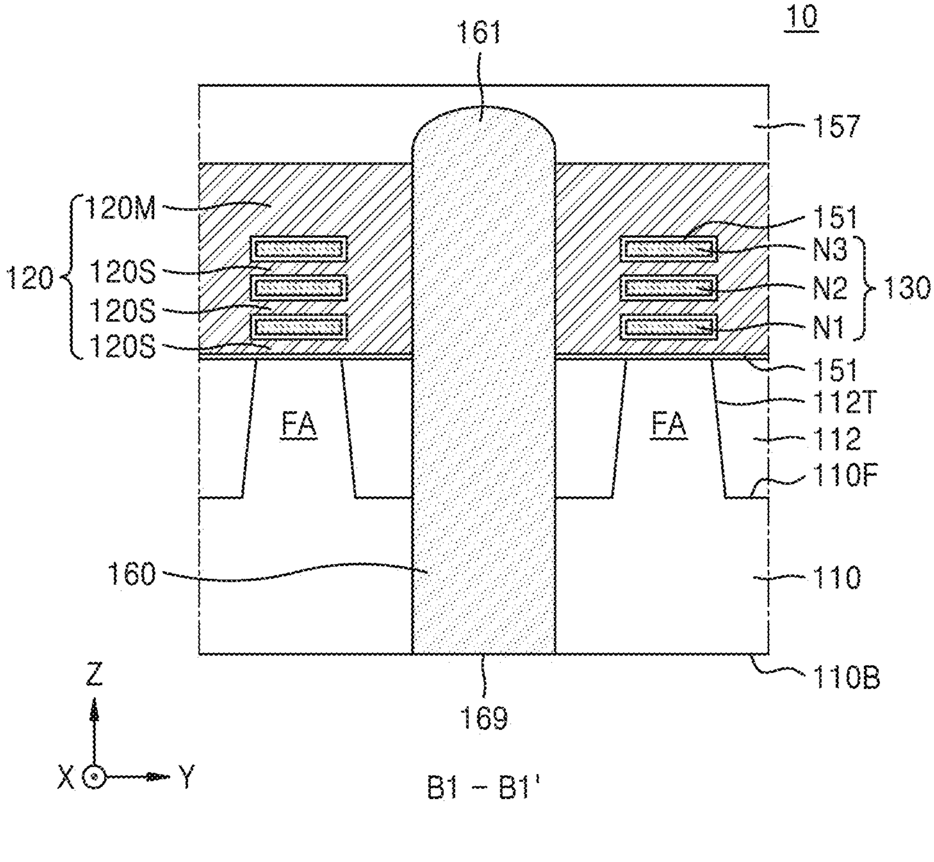
FIG. 3 is a cross-sectional view of the integrated circuit device taken along line B1-B1' of FIG. 1.

FIG. 1 is a layout schematically showing an integrated circuit device 10 according to some example embodiments. FIG. 2 is a cross-sectional view of the integrated circuit device 10 taken along line A1-A1' of FIG. 1. FIG. 3 is a cross-sectional view of the integrated circuit device 10 taken along line B1-B1' of FIG. 1.

Referring to FIG. 1 to FIG. 3, the integrated circuit device 10 may include a planar field-effect transistor (FET) device, a gate-all-around type FET device, a finFET device, and/or a multi-bridge channel FET (MBCFET™) device. The integrated circuit device 10 may include transistors TRI formed on and/or at least partially in a substrate 110. For example, the transistors TRI may configure logic cells of the MBCFET device. In some example embodiments, the transistors TRI may include a PMOS transistor and an NMOS transistor.

The substrate 110 may include a first surface 110F and a second surface 110B opposite to each other. In some example embodiments, the substrate 110 may include one or more of a group-IV semiconductor such as Si and/or Ge, a group IV-IV compound semiconductor such as SiGe or SiC, or a group III-V compound semiconductor such as GaAs, InAs, or InP. The substrate 110 may include a conductive region, for example, a well doped with impurities and/or a structure doped with impurities.

A plurality of fin-type active areas FA may be provided on the first surface 110F of the substrate 110. The plurality of fin type active areas FA may respectively protrude from the first surface 110F of the substrate 110. The plurality of fin type active areas FA may extend parallel to each other in the first horizontal direction (X-direction) and may be spaced apart from each other in the second horizontal direction (Y-direction). The plurality of fin type active areas FA may be respectively defined by isolation trenches 112T formed on the substrate 110.

Isolation layers 112 respectively covering side walls of the plurality of fin type active areas FA may be provided on the first surface 110F of the substrate 110. The isolation layer 112 may cover the first surface 110F of the substrate 110 and fill the isolation trench 112T formed in the substrate 110. The isolation layer 112 may include an oxide layer, a nitride layer, or a combination thereof. In some example embodiments, the isolation layer 112 may be or may include a shallow trench isolation (STI) structure; however, example embodiments are not limited thereto. A vertical level of the upper surface of the isolation layer 112 may be equal to or lower than that of the upper surface of each fin type active area FA; example embodiments are not limited thereto.

A plurality of channel structures 130 may be provided on the plurality of fin type active areas FA. The plurality of channel structures 130 may vertically overlap the corresponding fin type active areas FA, respectively. The plurality of channel structures 130 may each have a channel region through which the electric current flows. The plurality of channel structures 130 may each include a group-IV semiconductor such as Si or Ge, a group IV-IV compound semiconductor such as SiGe or SiC, or a group III-V compound semiconductor such as GaAs, InAs, or InP.

The plurality of channel structures 130 may each include a plurality of nano-sheets, for example, three nanosheets N1, N2, and N3 that vertically overlap the corresponding fin type active area FA. The plurality of nano-sheets N1, N2, and N3 may each configure a nano-sheet channel region. The plurality of nano-sheets N1, N2, and N3 may be spaced apart from each other in the vertical direction (Z-direction), and the lowermost nano-sheet N1 from among the plurality of nano-sheets N1, N2, and N3 may face the upper surface of the corresponding fin type active area FA. As described herein, the term 'nano-sheet' denotes a conductive structure having a cross-section that is substantially perpendicular to the direction in which the current flows. The nano-sheet has to be understood to include nano-wire. In FIGS. 2 and 3, one channel structure 130 includes three nano-sheets, but the number of nano-sheets included in one channel structure 130 is not particularly limited. For example, one channel structure 130 may include two or more nano-sheets.

A physical property and/or an electrical property, such as but not limited to a thickness and/or a resistivity, of each of the plurality of nano-sheets N1, N2, and N3 may be the same as each other, or, alternatively, at least one of the plurality of nanosheets N1, N2, and N3 may have a different physical property and/or a different electrical property. Example embodiments are not limited thereto.

In some example embodiments, the plurality of nano-sheets N1, N2, and N3 may each collectively or independently have a thickness selected within a range of about 4 nm to about 6 nm but is not limited thereto. Here, the thickness of the plurality of nano-sheets N1, N2, and N3 denotes a length in the vertical direction (Z-direction). In some example embodiments, the plurality of nano-sheets N1, N2, and N3 may have substantially the same thickness. In some example embodiments, at least some of the plurality of nano-sheets N1, N2, and N3 may have different thicknesses.

A plurality of gate lines 120 may be provided on the plurality of fin type active areas FA and the isolation layers 112. The plurality of gate lines 120 may extend parallel to each other in the second horizontal direction (Y-direction) and may be spaced apart from each other in the first horizontal direction (X-direction). The plurality of gate lines 120 may respectively surround corresponding channel structures 130. When seen on a plane, each of the plurality of channel structures 130 may be on each of cross regions between the plurality of gate lines 120 and the plurality of fin type active areas FA.

In some example embodiments, the plurality of gate lines 120 may include doped polysilicon, metal, conductive metal nitride, conductive metal carbide, conductive metal silicide, or a combination thereof. For example, the gate line 120 may include, but is not limited to, Al, Cu, Ti, Ta, W, Mo, TaN, NiSi, CoSi, TiN, WN, TiAl, TiAlN, TaCN, TaC, TaSiN, or a combination thereof.

In some example embodiments, each gate line 120 may include a main gate portion 120M and a plurality of sub-gate portions 120S. The main gate portion 120M may cover the upper surface of the uppermost nano-sheet N3 and may extend in the second horizontal direction (Y-direction). The plurality of sub-gate portions 120S may be each disposed between the plurality of nano-sheets N1, N2, and N3, and between the corresponding fin type active area FA and the lowermost nano-sheet N1. The plurality of sub-gate portions 120S may be connected to the main gate portion 120M.

A gate insulating layer 151 may be disposed between the plurality of nano-sheets N1, N2, and N3 and each gate line 120. The gate insulating layer 151 may include portions covering the surfaces of the plurality of nano-sheets N1, N2, and N3, a portion covering the side wall of the main gate portion 120M, a portion covering the upper surface of the fin type active area FA, and a portion covering the upper surface of the isolation layer 112.

In some example embodiments, the gate insulating layer 151 may include a high-k dielectric layer. The high-k dielectric layer may include a material having a dielectric constant that is greater than that of the silicon oxide layer. For example, the high-k dielectric layer may have a dielectric constant of about 10 to about 25. The high-k dielectric layer may include hafnium oxide but is not limited thereto.

An outer insulating spacer 153 may extend along the side wall of each gate line 120. The outer insulating spacer 153 may be disposed on opposite end portions of the uppermost nano-sheet N3 and may be spaced apart from the main gate portion 120M with the gate insulating layer 151 therebetween. In some example embodiments, the outer insulating spacer 153 may include silicon oxide, silicon nitride, silicon oxynitride, silicon carbonitride, silicon oxycarbonitride, or a combination thereof.

A plurality of source/drain regions 140 arranged in the first horizontal direction (X-direction) may be provided on each of the fin type active areas FA. A plurality of recesses RS may be formed so as to extend into the fin type active areas FA from the opposite sides of each gate line 120 (for example, two side portions of the gate lines 120 opposite to each other in the first horizontal direction (X-direction)), and the plurality of source/drain regions 140 may be formed in the plurality of recesses RS. As shown in FIG. 1, one channel structure 130 may be provided between two source/drain regions 140 that are adjacent to each other in the first horizontal direction (X-direction). The plurality of nano-sheets N1, N2, and N3 in each channel structure 130 may extend in the first horizontal direction (X-direction) between two source/drain regions 140 that are adjacent to each other in the first horizontal direction (X-direction). Each of the source/drain regions 140 may include a Si layer doped with n-type dopant such as but not limited to arsenic and/or phosphorus, and/or a Si layer doped with a p-type dopant such as but not limited to boron.

An internal insulating spacer 155 may be disposed between each of the plurality of sub-gate portions 120S of the gate line 120 and corresponding source/drain regions 140. Each of the plurality of sub-gate portions 120S may face the source/drain region 140 in the first horizontal direction (X-direction) with the gate insulating layer 151 and the internal insulating spacer 155 therebetween. The internal insulating spacer 155 may include portions provided between two adjacent nano-sheets from among the plurality of nano-sheets N1, N2, and N3, and a portion provided between the lowermost nano-sheet N1 and the upper surface of the fin type active area FA. In some example embodiments, the internal insulating spacer 155 may include silicon nitride, silicon oxide, SiCN, SiBN, SiON, SiOCN, SiBCN, SiOC, or a combination thereof.

Gate capping layers 157 may be disposed on the plurality of gate lines 120 and the outer insulating spacer 153. The gate capping layer 157 may extend along the upper surfaces of the plurality of gate lines 120 and the upper surface of the outer insulating spacer 153. In some example embodiments, the gate capping layer 157 may include silicon nitride.

An inter-gate insulating layer 159 covering the source/drain region 140 may be disposed between the plurality of gate lines 120. The inter-gate insulating layer 159 may include silicon oxide, silicon nitride, SiON, SiOCN, or a combination thereof.

Although not shown in the drawings, a back-end-of-line (BEOL) structure may be disposed on each of the gate capping layer 157 and the inter-gate insulating layer 159. The BEOL structure may include one or more of a contact structure electrically connected to the source/drain region 140 and/or the gate line 120, a via connected to the contact structure, and a metal wiring connected to the via. In some example embodiments, the BEOL structure may include a passivation layer; example embodiments are not limited thereto.

When seen on a plane, isolation structures 160 may be disposed on some of crossed regions between the plurality of fin type active areas FA and the plurality of gate lines 120. The isolation structure 160 may be or may correspond to a single diffusion break (SDB) structure for isolation between two devices that are adjacent to each other in the first horizontal direction (X-direction). The isolation structure 160 may be provided between two source/drain regions 140 that are successively arranged in the first horizontal direction (X direction).

When seen on a plane, the isolation structure 160, the source/drain regions 140, and the channel structures 130 may be aligned with or overlap each other in the first horizontal direction (X-direction) in one fin type active area FA vertically overlapping the isolation structure 160. When seen on a plane, the channel structure 130, the source/drain region 140, and the isolation structure 160 may be sequentially arranged in the first horizontal direction (X-direction), at a vicinity of the isolation structure 160.

A length such as a maximum length of the isolation structure 160 in the first horizontal direction (X-direction) may be equal to or greater than a length such as a maximum length of the gate line 120 in the first horizontal direction (X-direction). For example, the maximum length of the isolation structure 160 in the first horizontal direction (X-direction) may be within a range of about 100% to about 200% of the maximum length of the gate line 120 in the first horizontal direction (X-direction). A maximum length of the isolation structure 160 in the second horizontal direction (Y-direction) may be equal to or greater than a maximum length of the upper surface of the fin type active area FA in the second horizontal direction (Y-direction).

The isolation structure 160 may extend upward from the second surface 110B of the substrate (that is, a direction from the second surface 110B of the substrate 110 toward the first surface 110F. The isolation structure 160 may perpendicularly pass through the substrate 110 and the corresponding fin type active area FA and may extend to the inside of the corresponding gate line 120. In some example embodiments, the isolation structure 160 may perpendicularly pass through the corresponding gate line 120. In some example embodiments, the isolation structure 160 may extend in the gate capping layer 157 but may not pass through the gate capping layer 157. The upper surface of the isolation structure 160 may be covered by the gate capping layer 157 and may come into direct contact with the gate capping layer 157.

The isolation structure 160 may include an insulating material filling an isolation hole (see 160H of FIG. 13A) extending upward from the second surface 110B of the substrate 110. For example, the isolation structure 160 may include silicon nitride, silicon oxide, silicon oxynitride, silicon carbonitride, silicon oxycarbonitride, or a combination thereof. In some example embodiments, the material in the isolation structure 160 may be the same as that of the gate capping layer 157. For example, the isolation structure 160 and the gate capping layer 157 may include silicon nitride. In some example embodiments, the material in the isolation structure 160 may be different from that of the gate capping layer 157.

In some example embodiments, a lower surface 169 of the isolation structure 160 may be at the same plane as that of the second surface 110B of the substrate 110.

In some example embodiments, an upper portion 161 of the isolation structure 160 may have a tapered shape of which a horizontal width is narrowed away from the first surface 160F of the substrate 110.

In an integrated circuit device according to a comparative example, an isolation structure for isolating two device regions adjacent to each other in the X-direction may extend from the upper side of the integrated circuit device in the downward direction and may fill a part of the upper side of a substrate. Because the isolation structure does not completely pass through the substrate, perfect isolation between two device regions adjacent to each other in the X-direction may not be secured according to an issue such as a process distribution, etc. Alternatively or additionally, a size of the opening in an etching mask layer is increased to form the isolation structure deeper, but this method may cause physical damage to the mask layer or the source/drain region is covered by the insulating material included in the isolation structure and may cause the contact defects between the source/drain region and the contact structure.

However, according to some example embodiments, the integrated circuit device 10 includes the isolation structure 160 extending upward from the lower side of the substrate 110 and passes through the substrate 110, and thus, the defective issue such as the contact defects may be removed and simultaneously, the complete isolation between two adjacent device regions may be or may be more likely to be achieved. Therefore, the reliability of isolating the devices in the integrated circuit device 10 may be improved.

According to the integrated circuit device 10 of various example example embodiments, the plurality of fin type active areas FA include a first fin type active area coming into contact with the isolation structure 160 and a second fin type active area spaced apart from the first fin type active area in the second horizontal direction (Y-direction) with the isolation layer 112 therebetween, and the plurality of channel structures 130 include a first channel structure and a second channel structure that are spaced apart from each other with the isolation structure 160 therebetween on the first fin type active area, the plurality of gate lines 120 include a first gate line surrounding the first channel structure, a second gate line surrounding the second channel structure, and a third gate line disposed between the first gate line and the second gate line in the first horizontal direction (X-direction) and coming into contact with the isolation structure 160, and the plurality of source/drain regions 140 include a first source/drain region between the first channel structure and the isolation structure 160 in the first horizontal direction (X-direction) and a second source/drain region between the second channel structure and the isolation structure 160 in the first horizontal direction (X-direction). Here, the first channel structure and the first source/drain region form the first device area at one side of the isolation structure 160, the second channel structure and the second source/drain region form a second device area at the other side of the isolation structure 160, and the first device area and the second device area may be isolated by the isolation structure 160. In some example embodiments, the isolation structure 160 vertically overlaps the first fin type active area, and may not vertically overlap the second fin type active area.

Figure 4:
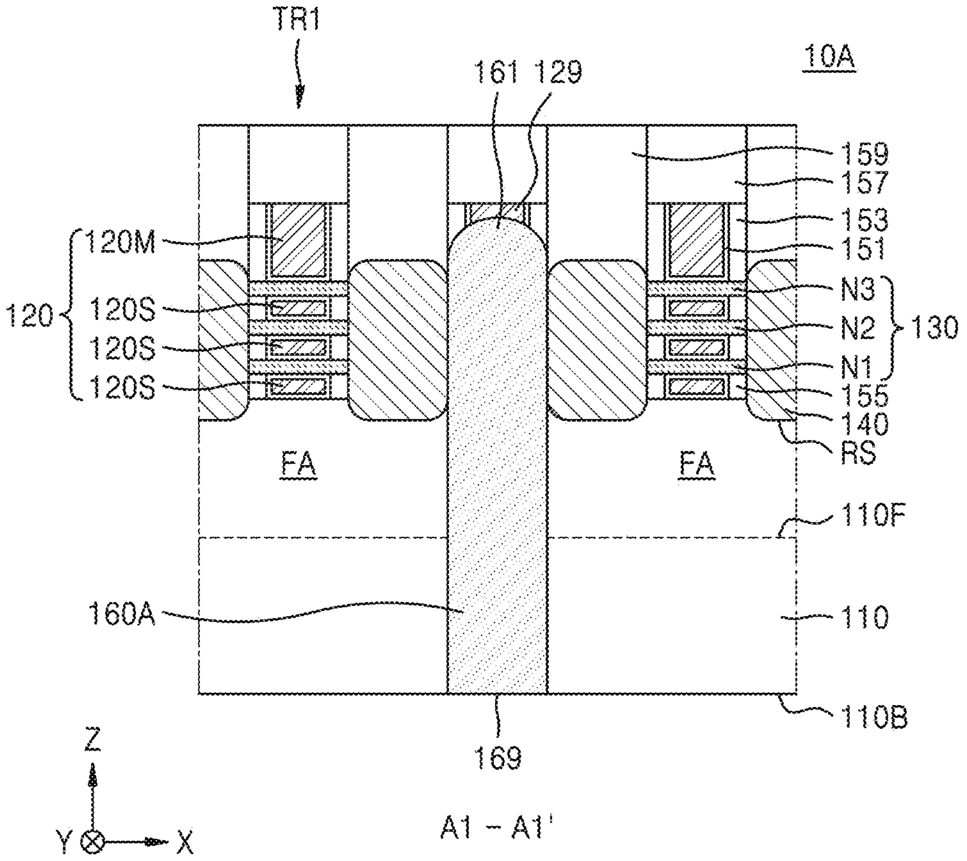
FIG. 4 is a cross-sectional view of an integrated circuit device according to some example embodiments.
Figure 5:
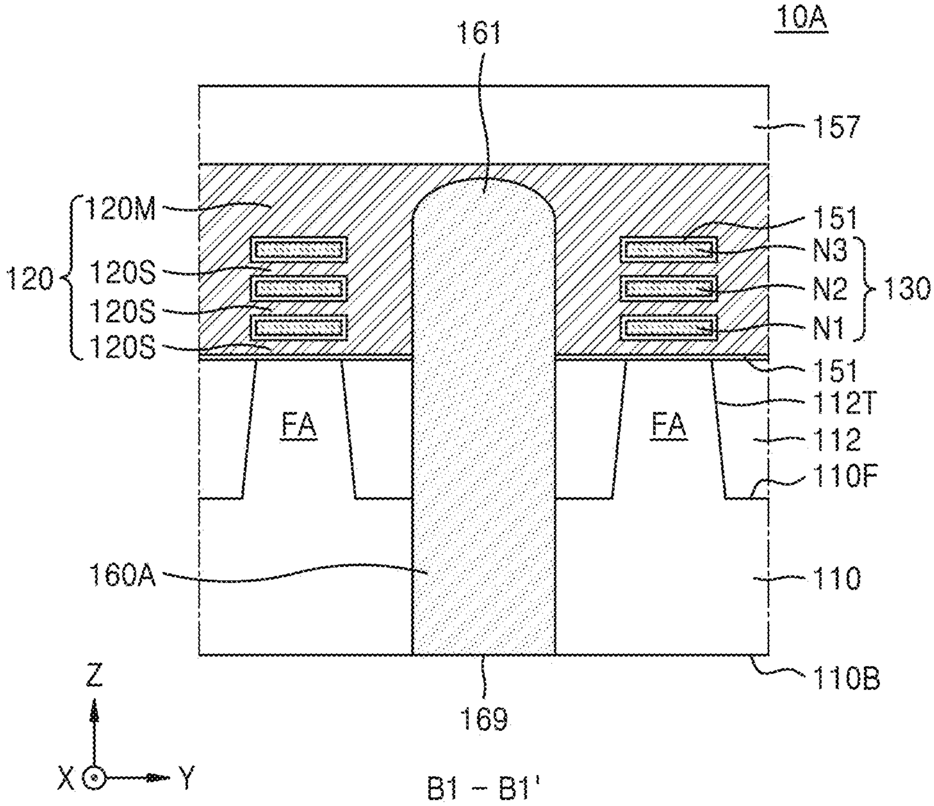
FIG. 5 is a cross-sectional view of an integrated circuit device according to some example embodiments.

FIGS. 4 and 5 are cross-sectional views showing different cross-sections of an integrated circuit device 10A according to some example embodiments. FIG. 4 shows a cross-section of the integrated circuit device 10A taken along line A1-A' of FIG. 1, and FIG. 5 shows a cross-section of the integrated circuit device 10A taken along line B1-B1' of FIG. 1. Hereinafter, the integrated circuit device 10A shown in FIGS. 4 and 5 is described below based on the differences from the integrated circuit device 10 described above with reference to FIGS. 1 to 3.

Referring to FIGS. 4 and 5, in the integrated circuit device 10A, an isolation structure 160A may extend upward from the second surface 110B of the substrate 110 (that is, a direction from the second surface 110B of the substrate 110 toward the first surface 110F, and may be spaced apart from the gate capping layer 157. For example, the uppermost end of the isolation structure 160A may be spaced apart from the lower surface of the gate capping layer 157. Between the isolation structure 160A and the gate capping layer 157, a gate line residual 129 that is part of the gate line 120, part of the outer insulating spacer 153, and part of the gate insulating layer 151 may be provided. The gate line residual 129 may correspond to a dummy structure. In some example embodiments, the gate line residual 129 may not be electrically active during operation of the integrated circuit device 10B.

Figure 6:
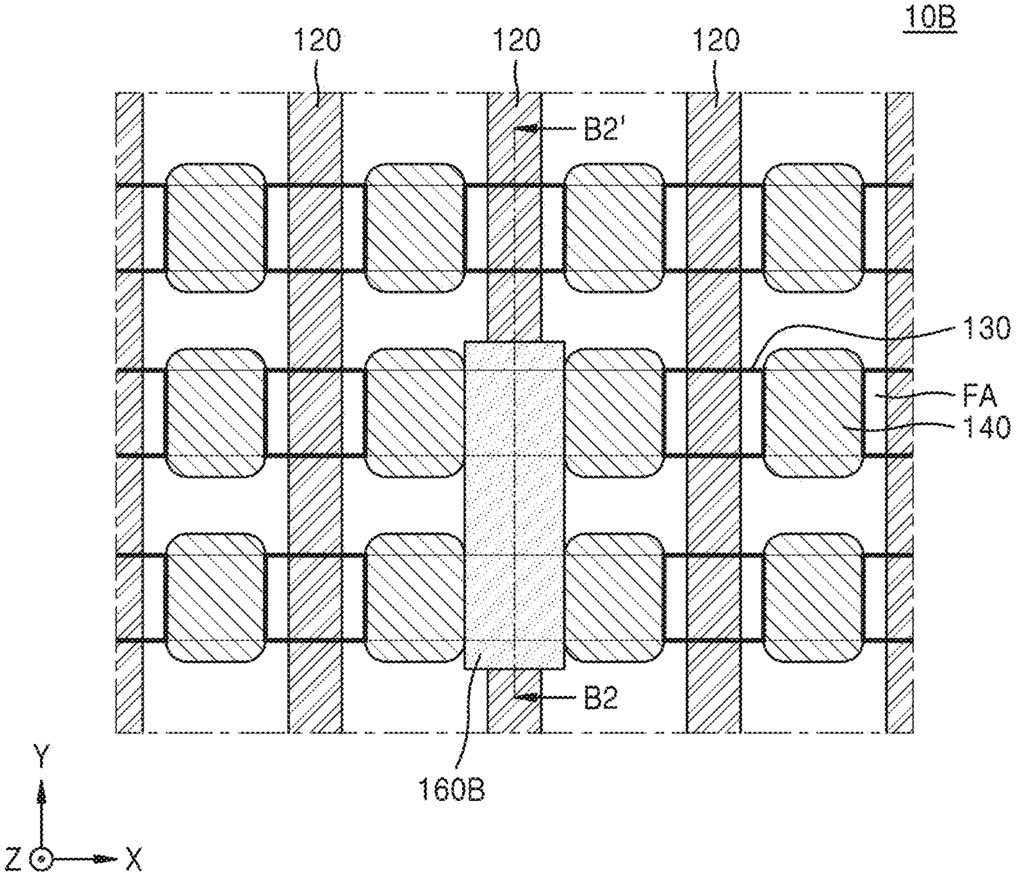
FIG. 6 is a diagram schematically showing a layout of an integrated circuit device according to some example embodiments.
Figure 7:
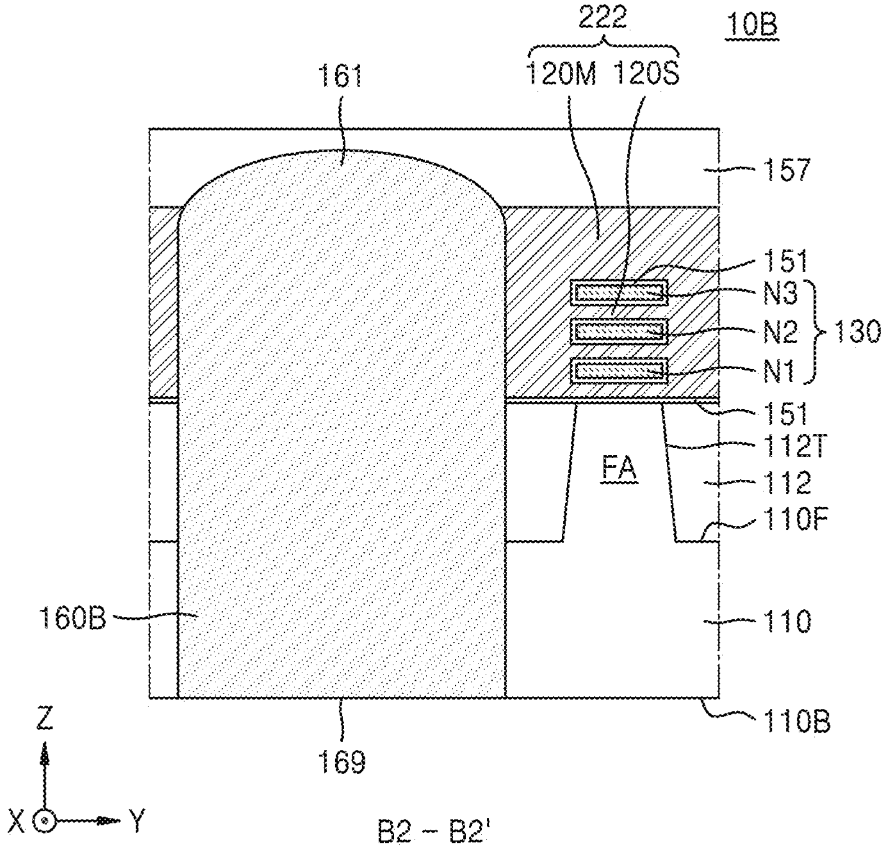
FIG. 7 is a cross-sectional view of the integrated circuit device taken along line B2-B2' of FIG. 6.

FIG. 6 is a layout schematically showing an integrated circuit device 10B according to some example embodiments. FIG. 7 is a cross-sectional view of the integrated circuit device 10B taken along line B2-B2' of FIG. 6. Hereinafter, the integrated circuit device 10B shown in FIGS. 6 and 7 is described below based on the differences from the integrated circuit device 10 described above with reference to FIGS. 1 to 3.

Referring to FIGS. 6 and 7, when seen on a plane, an isolation structure 160B may extend in the second horizontal direction (Y-direction) across the plurality of fin type active areas FA that are successively arranged in the second horizontal direction (Y-direction). When seen on a plane, the isolation structure 160B may extend parallel to the gate line 120. On each of the plurality of fin type active areas FA, two device regions adjacent to each other in the first horizontal direction (X-direction) may be isolated by the isolation structure 160B.

For example, the isolation structure 160B may extend in the second horizontal direction (Y-direction) across two fin type active areas FA that are successively arranged in the second horizontal direction (Y-direction). The isolation structure 160B may be aligned or overlap the channel structure 130 and the source/drain region 140 on one fin type active area FA in the first horizontal direction (X-direction), and may be aligned with or overlap another channel structure 130 and another source/drain region 140 on another fin type active area FA in the first horizontal direction (X-direction).

In the integrated circuit device 10B according to some example embodiments, the plurality of fin type active areas FA include a first fin type active area being in contact with the isolation structure 160 and a second fin type active area that is spaced apart from the first fin type active area in the second horizontal direction (Y-direction) with the isolation layer 112 therebetween, the plurality of channel structures 130 include a first channel structure and a second channel structure that are spaced apart from each other in the first horizontal direction (X-direction) on the first fin type active area with the isolation structure 160 therebetween, and a third channel structure and a fourth channel structure that are spaced apart from each other in the first horizontal direction (X-direction) on the second fin type active area with the isolation structure 160 therebetween, the plurality of gate lines 120 include a first gate line surrounding the first channel structure and the third channel structure, a second gate line surrounding the second channel structure and the fourth channel structure, and a third gate line disposed between the first gate line and the second gate line in the first horizontal direction (X-direction) and being in contact with the isolation structure 160, and a plurality of source/drain regions 140 include a first source/drain region between the first channel structure and the isolation structure 160 in the first horizontal direction (X-direction), a second source/drain region between the second channel structure and the isolation structure 160 in the first horizontal direction (X-direction), a third source/drain region between the third channel structure and the isolation structure 160 in the first horizontal direction (X-direction), and a fourth source/drain region between the fourth channel structure and the isolation structure 160 in the first horizontal direction (X-direction). Here, the first channel structure and the first source/drain region form the first device area at one side of the isolation structure 160, the second channel structure and the second source/drain region form a second device area at the other side of the isolation structure 160, and the first device area and the second device area may be isolated by the isolation structure 160. Also, the third channel structure and the third source/drain region form the third device area at one side of the isolation structure 160, the fourth channel structure and the fourth source/drain region form a fourth device area at the other side of the isolation structure 160, and the third device area and the fourth device area may be isolated by the isolation structure 160. When seen on a plane, the isolation structure 160 may extend in the second horizontal direction (Y-direction) across the first fin type active area and the second fin type active area. In FIG. 6, it is shown that the isolation structure 160 extends across two fin type active areas FA that are successively arranged in the second horizontal direction (Y-direction) as an example but example embodiments are not limited thereto. For example, the isolation structure 160 may extend across three or more fin type active areas FA that are successively arranged in the second horizontal direction (Y-direction) and may be configured to provide the device regions respectively on three or more fin type active areas FA, the device regions being isolated in the first horizontal direction (X-direction).

FIGS. 8A to 14B are cross-sectional views for describing a method of manufacturing an integrated circuit device, according to some example embodiments. FIGS. 8A, 9A, 10A, 11A, 12A, 13A, and 14A are cross-sectional views taken alone line A1-A1' of FIG. 1 according to a processing order, and FIGS. 8B, 9B, 10B, 11B, 12B, 13B, and 14B are cross-sectional views taken along line B1-B1' of FIG. 1 according to a processing order. Hereinafter, a method of manufacturing the integrated circuit device 10 described above with reference to FIGS. 1 to 3 is described below with reference to FIGS. 8A to 14B.

Figure 8A:
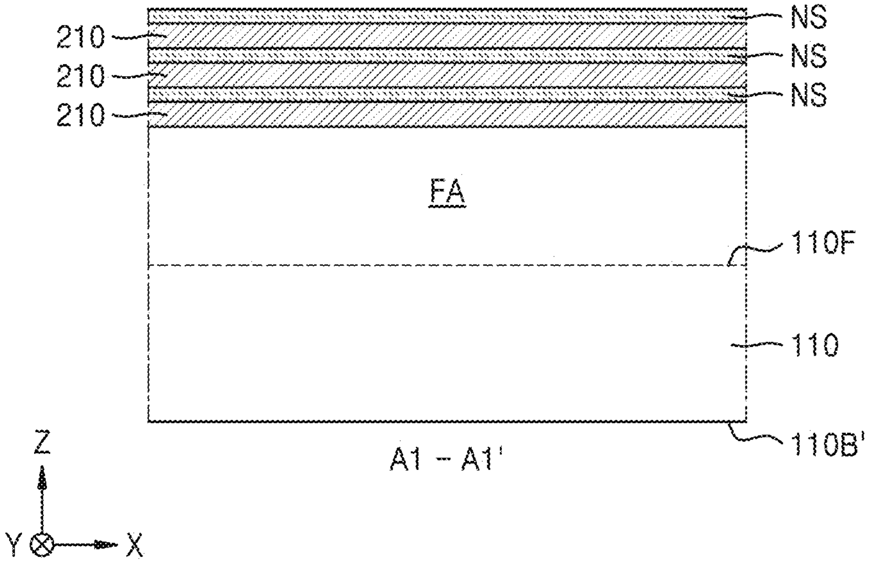
FIGS. 8A to 14B are cross-sectional views for describing a method of manufacturing an integrated circuit device, according to some example embodiments.
Figure 8B:
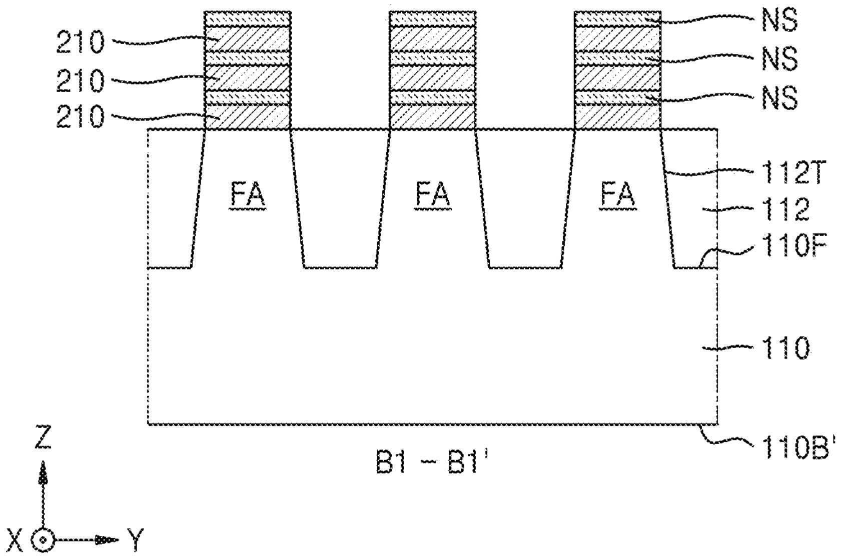

Referring to FIGS. 8A and 8B, a plurality of sacrificial semiconductor layers 210 and a plurality of nano-sheet semiconductor layers NS are alternately stacked one-by-one on the substrate 110, and isolation trenches 112T are formed in the substrate 110 by etching some parts of the plurality of sacrificial semiconductor layers 210, the plurality of nano-sheet semiconductor layers NS, and the substrate 110.

In some example embodiments, the plurality of sacrificial semiconductor layers 210 and the plurality of nano-sheet semiconductor layers NS may be formed through an epitaxial growth process, in which the substrate 110 is used as an seed layer. Otherwise, the plurality of sacrificial semiconductor layers 210 and the plurality of nano-sheet semiconductor layers NS may be deposited, e.g., with one or more of a chemical vapor deposition (CVD) process, an atomic layer deposition (ALD) process, or a physical vapor deposition (PVD) process; example embodiments are not limited thereto. In some example embodiments, the CVD process may include one or more of a plasma-enhanced CVD (PECVD) process or a low pressure CVD (LPCVD) process; example embodiments are not limited thereto.

As a result, the fin type active areas FA that protrude from the first surface 110F of the substrate 110 in the vertical direction (Z-direction) are formed, and stack structures including the plurality of sacrificial semiconductor layers 210 and the plurality of nano-sheet semiconductor layers NS may be disposed respectively on the fin type active areas FA. The plurality of sacrificial semiconductor layers 210 and the plurality of nano-sheet semiconductor layers NS may include semiconductor materials having different etch selectivity from each other. In some example embodiments, the plurality of nano-sheet semiconductor layers NS may include Si layers, and the plurality of sacrificial semiconductor layers 210 may include SiGe layers. After that, the isolation layers 112 filling the isolation trenches 112T are formed.

Figure 9A:
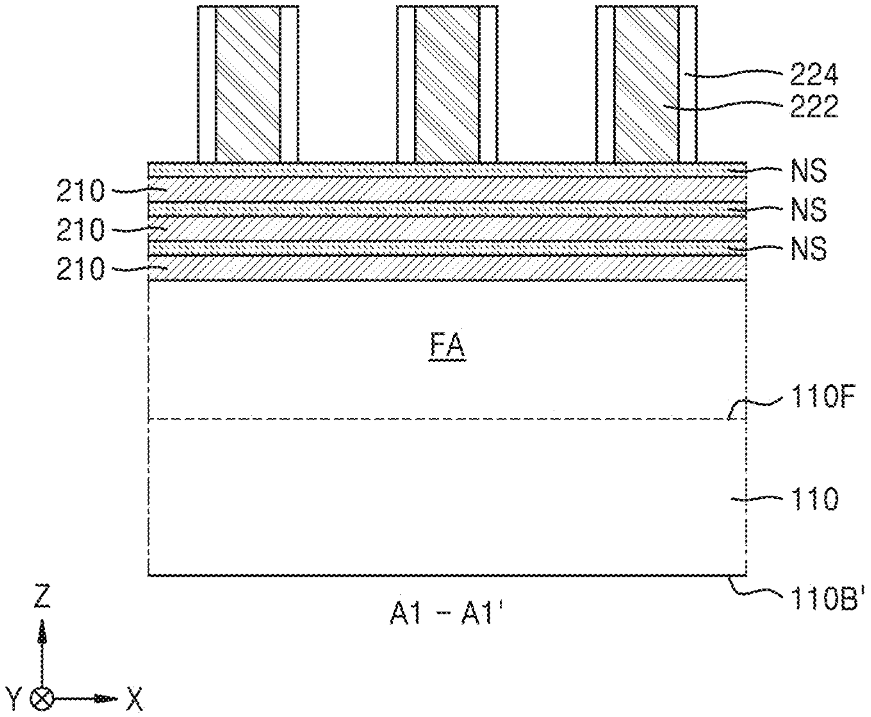
Figure 9B:
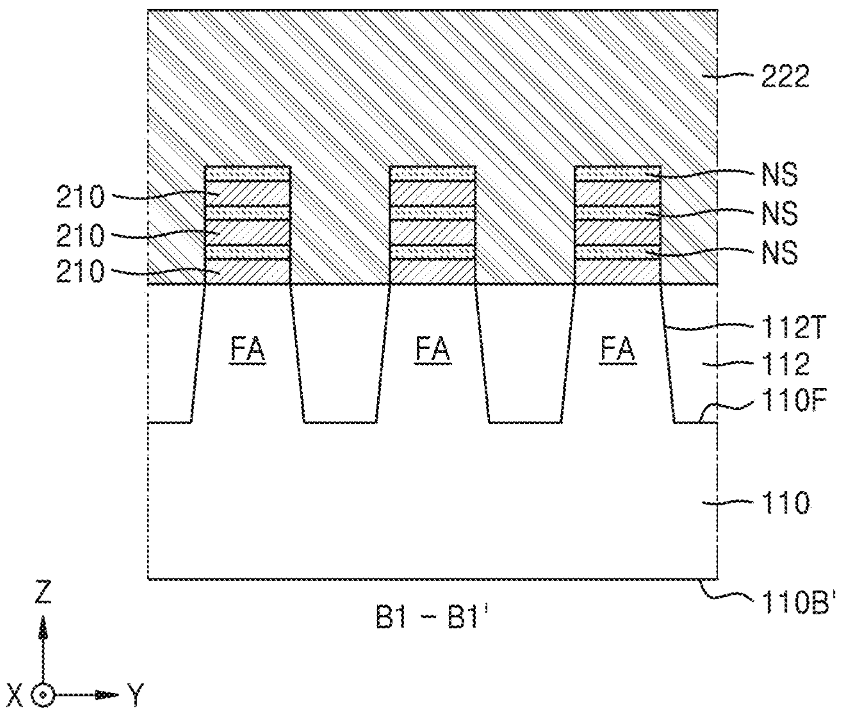

Referring to FIGS. 9A and 9B, a dummy gate pattern 222 is formed on the resultant of FIGS. 8A and 8B. The dummy gate pattern 222 may be formed to extend in the second horizontal direction (Y-direction) on the plurality of nano-sheet semiconductor layers NS and the isolation layers 112.

After that, a preliminary spacer structure 224 covering sidewalls of the dummy gate pattern 222 is formed on the plurality of nano-sheet semiconductor layers NS and the isolation layers 112. The preliminary spacer structure 224 may cover the sidewalls of the dummy gate pattern 222.

Figure 10A:
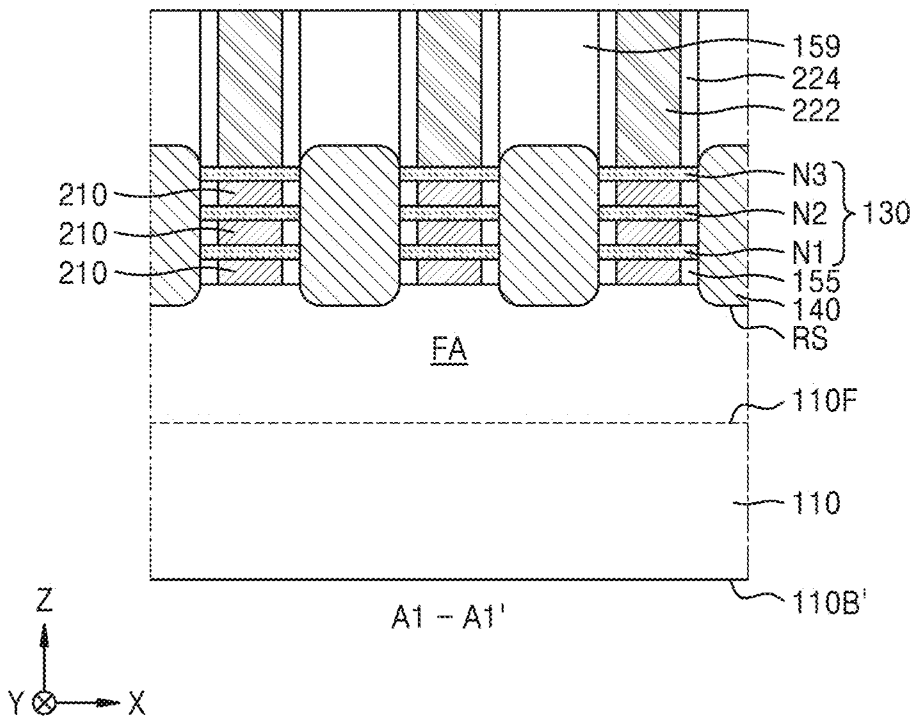
Figure 10B:
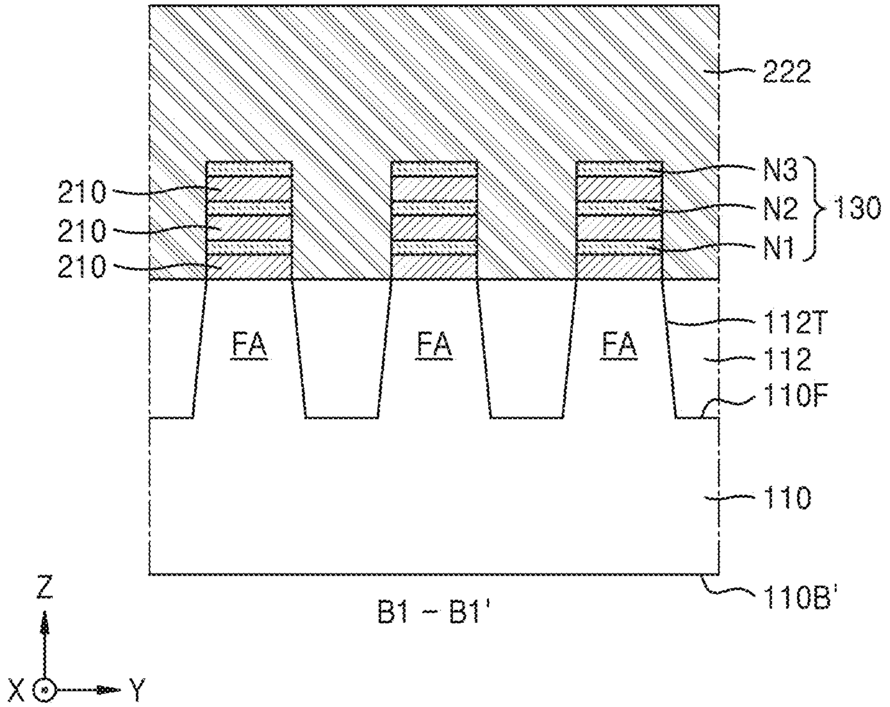

Referring to FIGS. 10A and 10B, each of the plurality of sacrificial semiconductor layers 210 and each of the plurality of nano-sheet semiconductor layers NS are partially and selectively removed from the resultant of FIGS. 8A and 8B, and thus, the channel structure 130 including a plurality of nano-sheets N1, N2, and N3 is formed from the plurality of nano-sheet semiconductor layers NS.

After that, the fin type active area FA is partially etched from opposite sides of the channel structure 130 to form a plurality of recesses RS in the upper portion of the fin type active area FA, and the plurality of sacrificial semiconductor layers 210 exposed through the opposite sides of the channel structure 130 through the plurality of recesses RS are selectively removed to form a plurality of indent spaces. After that, a plurality of inner insulating spacers 155 filling the plurality of indent spaces are formed, and the plurality of source/drain regions 140 filling the plurality of recesses RS at the opposite sides of the channel structure 130 may be formed. The plurality of source/drain regions 140 may be each formed at the position spaced apart from the dummy gate pattern 222 with the preliminary spacer structure 224 therebetween. For example, the plurality of source/drain regions 140 may be formed through an epitaxial process. After that, inter-gate insulating layers 159 covering the plurality of source/drain regions 140 are formed.

Figure 11A:
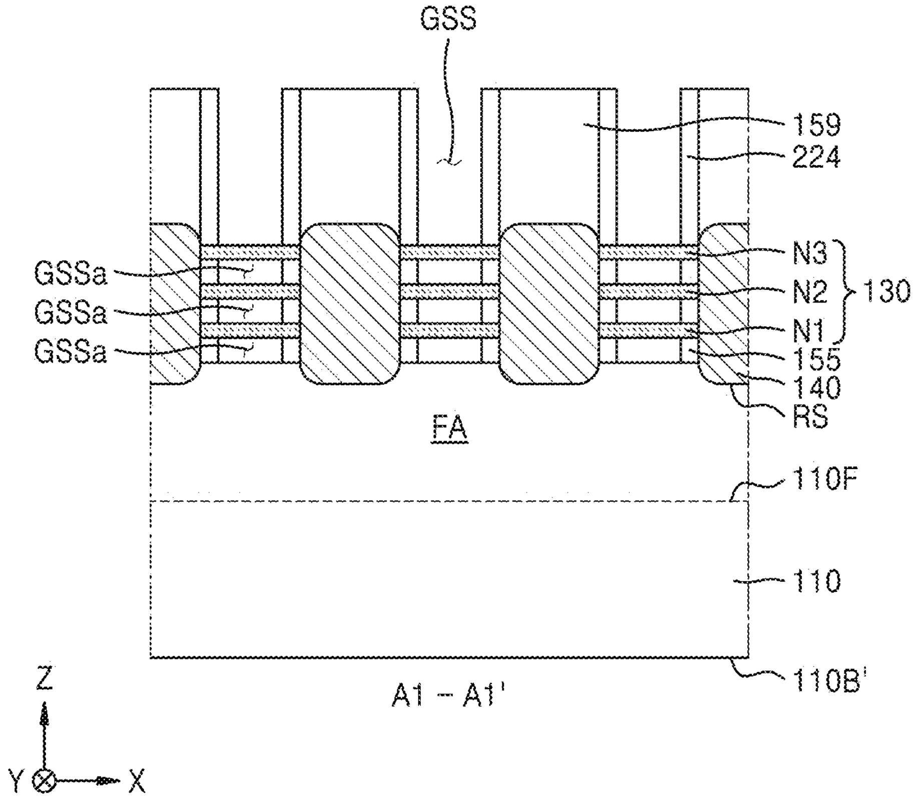
Figure 11B:
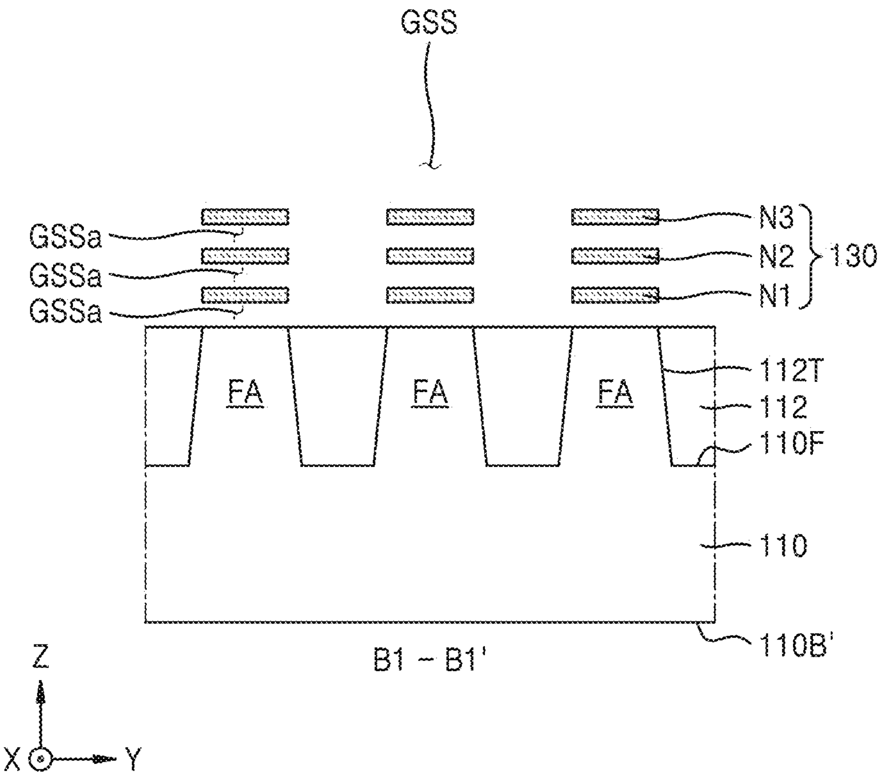

Referring to FIGS. 11A and 11B, the dummy gate pattern 222 is removed from the resultant of FIGS. 10A and 10B, and then, a main gate space GSS is formed on the upper portion of each of the plurality of channel structures 130 and the isolation layers 112. After forming the main gate space GSS, the plurality of sacrificial semiconductor layers 210 remaining on the fin type active areas FA are selectively removed through the main gate spaces GSS, and thus, sub-gate spaces GSSa may be formed among the plurality of nano-sheets N1, N2, and N3 and between the lowermost nano-sheet N1 and the upper surface of the fin type active area FA. In some example embodiments, in order to selectively remove the plurality of sacrificial semiconductor layers 210, the difference between the plurality of nano-sheets N1, N2, and N3 and the plurality of sacrificial semiconductor layers 210 may be used. In order to selectively remove the plurality of sacrificial semiconductor layers 210, a wet and/or a dry etching process may be used.

Figure 12A:
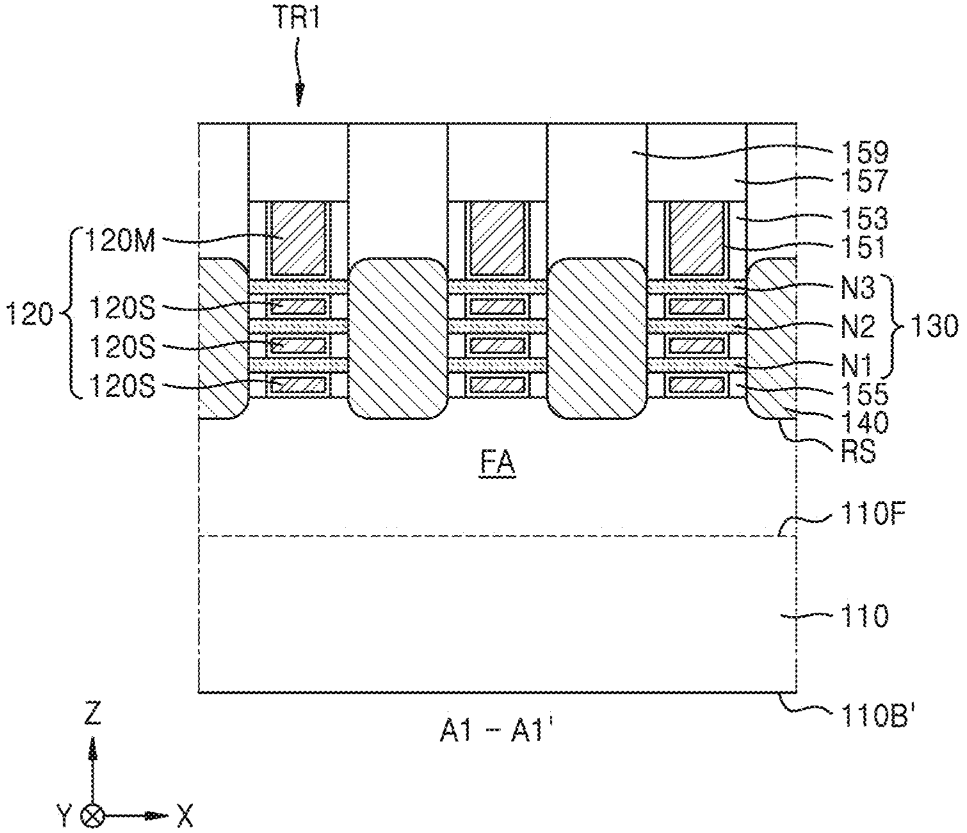
Figure 12B:
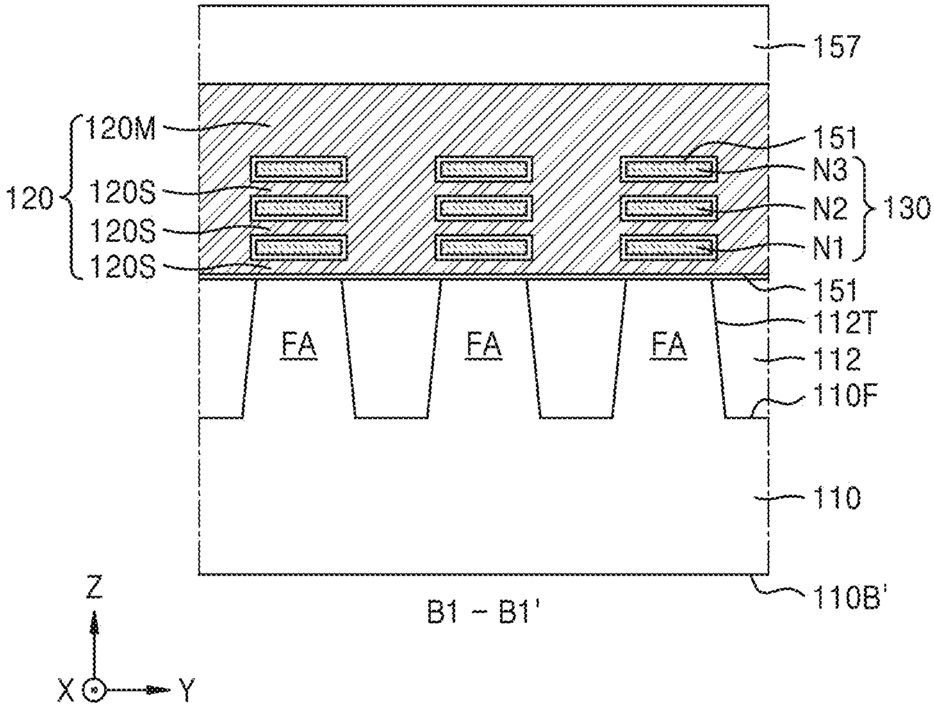

Referring to FIGS. 12A and 12B, a high-k dielectric layer is formed on the resultant of FIGS. 11A and 11B, and thus, the gate insulating layers 151 covering the exposed surfaces of the plurality of nano-sheets N1, N2, and N3 and the fin type active areas FA in the main gate spaces GSS and the sub-gate spaces GSSa may be formed.

Next, a conductive layer filling the main gate spaces GSS and the sub-gate spaces GSSa while covering the gate insulating layers 151 is formed, and after that, the conductive layer, the gate insulating layers 151, and the preliminary spacer structure 224 may be partially removed. A remaining portion of the conductive layer may be the gate lines 120, and the remaining portion of the preliminary spacer structure 224 may become the outer insulating spacer 153. After that, the gate capping layer 157 is formed on the upper side of the main gate spaces GSS.

Figure 13A:
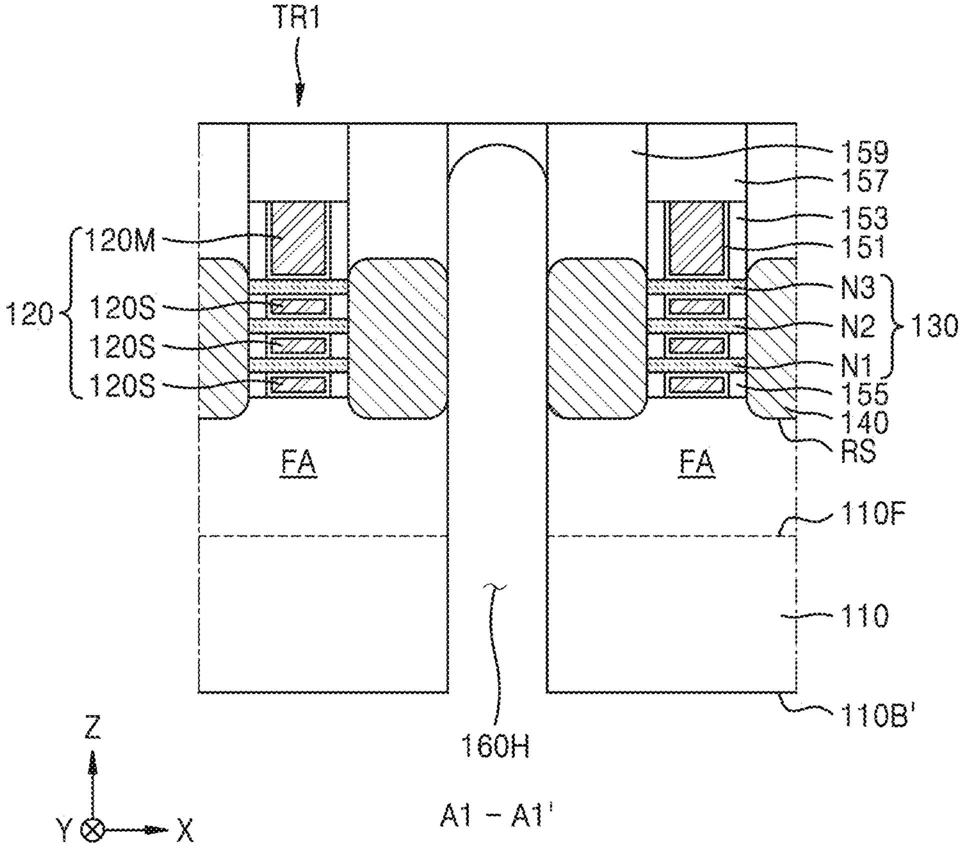
Figure 13B:
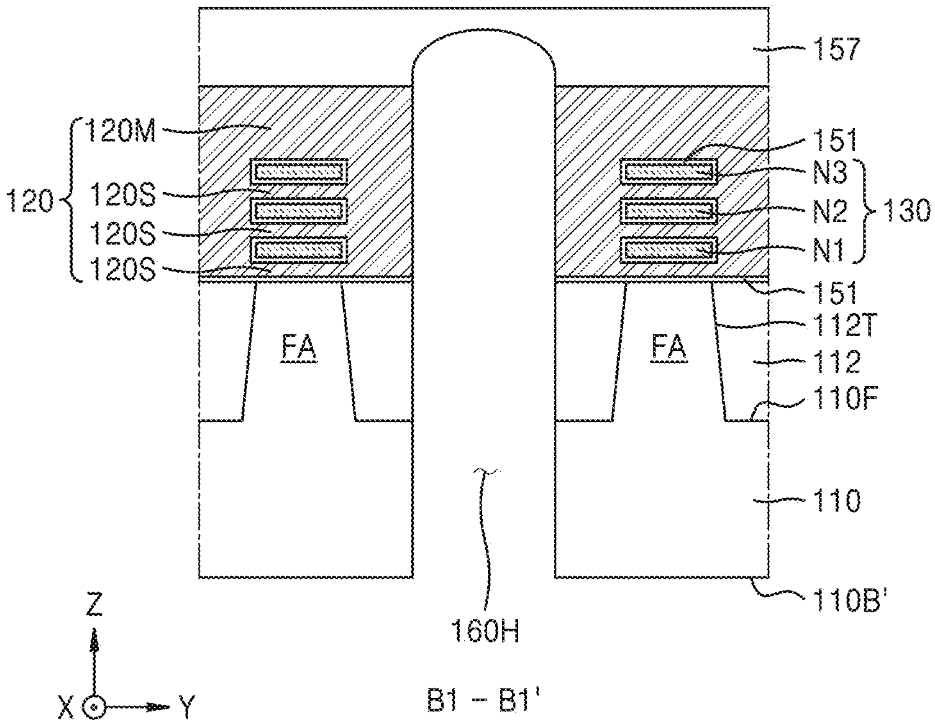

Referring to FIGS. 13A and 13B, an isolation hole 160H extending from a second surface 110B' of the substrate 110 is formed in the resultant of FIGS. 12A and 12B, and then one channel structure 130 may be removed. For example, the isolation hole 160H may be defined by the surface of the substrate 110, the surface of the isolation layer 112, the surface of the gate line 120, the surfaces of the source/drain regions 140 facing each other in the first horizontal direction (X-direction), and the surface of the gate capping layer 157.

In order to form the isolation hole 160H, an etch mask covering the second surface 110B' of the substrate 110 is formed, and parts of the substrate 110, at least part of one active area, one channel structure 130, part of the gate line 120, one channel structure 130, and part of the gate capping layer 157, which overlap openings of the etch mask, may be removed through an etching process. In the above etching process, the gate capping layer 157 may be used as an etch stop layer.

In some example embodiments, prior to forming the isolation hole 160H, an upper surface of the integrated circuit device may be passivated, e.g., may have one or more materials such as photoresist placed on the upper surface of the integrated circuit device. The integrated circuit device may then be flipped, and the etch mask covering the second surface 110B' of the substrate 110 may then be patterned and etched. Example embodiments are not limited thereto.

Figure 14A:
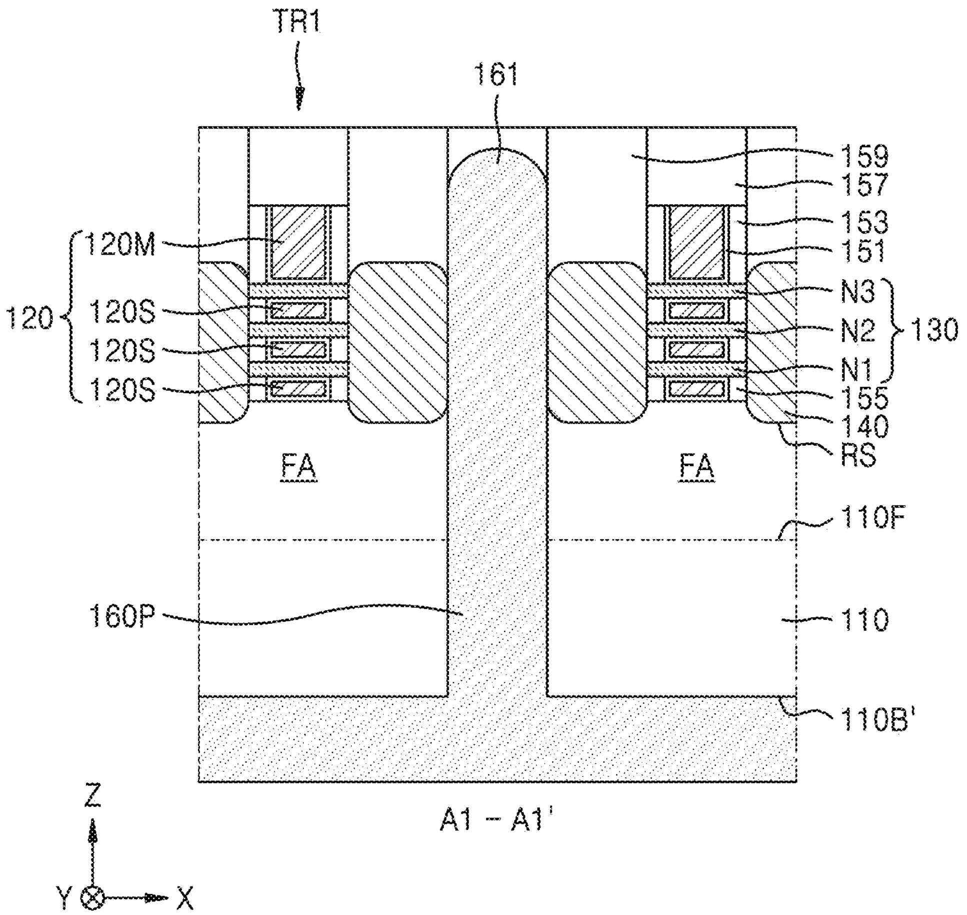
Figure 14B:
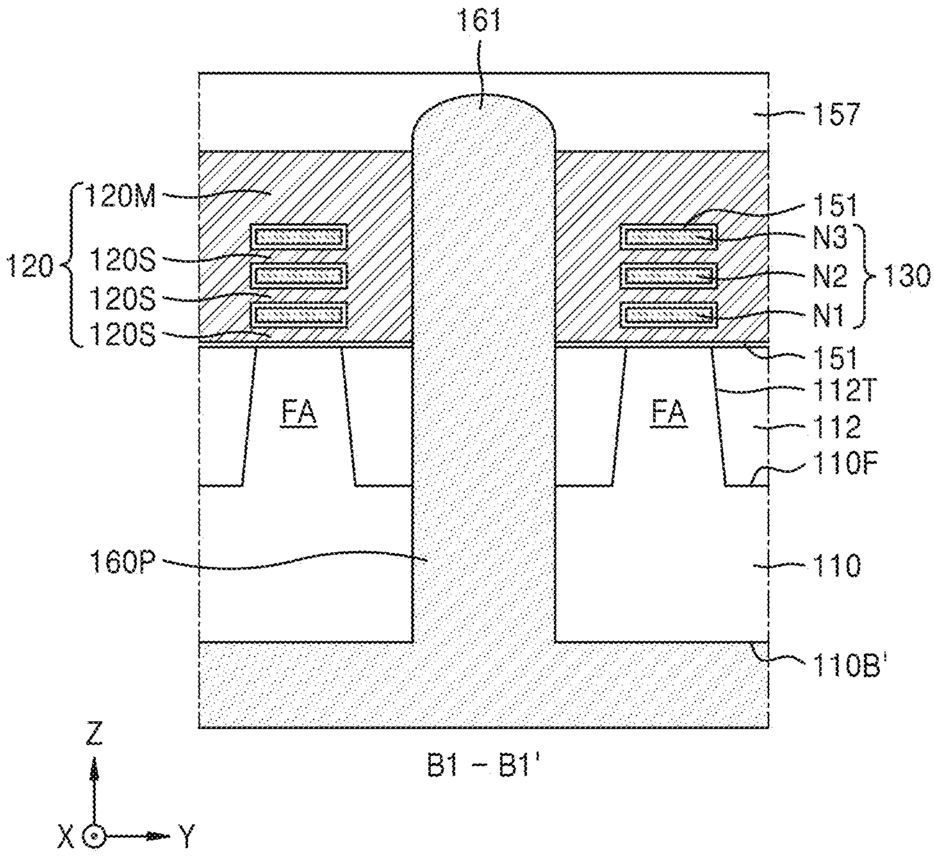

Referring to FIGS. 14A and 14B, a preliminary isolation structure 160P covering the second surface 110B' of the substrate 110 and filling the isolation hole 160H is formed. In some example embodiments, the preliminary isolation structure 160P may be formed with a deposition process such as but not limited to a CVD process and/or a PVD process; example embodiments are not limited thereto.

Referring to FIGS. 2 and 3, a planarization process, e.g., a chemical mechanical polishing process and/or an etch-back process, is performed from the lower side of the resultant of FIGS. 14A and 14B. The planarization process may be performed until the substrate 110 is exposed. Through the planarization process, the preliminary isolation structure 160P covering the second surface 110B' of the substrate 110 may be partially removed. The remaining portion of the preliminary isolation structure 160P after the planarization process may become the isolation structure 160 filling the isolation hole 160H. Alternatively or additionally, through the planarization process, the substrate 110 may be partially removed so that the thickness of the substrate 110 may be reduced, and the second surface 110B of the substrate 110 may be planarized. As a result of the planarization process, the planarized lower surface 169 of the isolation structure 160 may be on the same plane as that of the planarized second surface 110B of the substrate 110.

While various example embodiments have been particularly shown and described, it will be understood that various changes in form and details may be made therein without departing from the spirit and scope of the following claims. Additionally, example embodiments are not necessarily mutually exclusive with one another. For example, some example embodiments may include one or more features described with reference to one or more figures, and may also include one or more features described with reference to one or more other figures.

What is claimed is:

1. An integrated circuit device comprising:

a substrate including a first surface and a second surface that are opposite to each other;

a fin type active area extending in a first direction from the first surface of the substrate;

a channel structure on an upper surface of the fin type active area and including a channel region;

a source/drain region on the upper surface of the fin type active area;

a gate line on the substrate, extending in a second direction that is perpendicular to the first direction, and surrounding the channel structure;

an isolation structure passing vertically through the substrate and the fin type active area and at one side of the source/drain region; and an inter-gate insulating layer covering the source/drain region, wherein the channel structure, the source/drain region, and the isolation structure are sequentially arranged in the first direction.

2. The integrated circuit device of claim 1, wherein the channel structure includes a plurality of nano-sheets spaced apart from each other in a vertical direction.

3. The integrated circuit device of claim 1, wherein a lower surface of the isolation structure is coplanar with the second surface of the substrate.

4. The integrated circuit device of claim 1, wherein an upper portion of the isolation structure has a tapered shape of which a horizontal width narrows away from the first surface of the substrate.

5. The integrated circuit device of claim 1, further comprising:

a gate capping layer covering the gate line and the isolation structure, wherein the isolation structure extends in the gate capping layer.

6. The integrated circuit device of claim 5, wherein the gate capping layer and the isolation structure include a same material.

7. The integrated circuit device of claim 5, wherein the isolation structure does not pass through the gate capping layer.

8. The integrated circuit device of claim 1, further comprising:

a gate capping layer covering the gate line and the isolation structure, wherein the isolation structure is spaced apart from the gate capping layer.

9. The integrated circuit device of claim 8, wherein the gate line is at least partially between the isolation structure and the gate capping layer.

10. The integrated circuit device of claim 1, wherein the fin type active area includes a first fin type active area, the channel structure includes a first channel structure, the source/drain region includes a first source/drain region, the integrated circuit device further comprises a second source/drain region, a second fin type active area, and a second channel structure, the second fin type active area extending on the first surface of the substrate in the first direction and spaced apart from the first fin type active area in the second direction with an isolation layer therebetween, the second channel structure spaced apart from the upper surface of the second fin type active area and including a channel region, the second source/drain region on the upper surface of the second fin type active area, and the isolation structure at least partially overlaps the second channel structure and the second source/drain region in the first direction.

11. The integrated circuit device of claim 1, wherein the isolation structure includes silicon nitride.

12. An integrated circuit device comprising:

a substrate including a first surface and a second surface that are opposite to each other;

a first fin type active area extending from the first surface of the substrate in a first direction;

a first channel structure and a second channel structure on an upper surface of the first fin type active area and spaced apart from each other in the first direction;

a first gate line on the substrate, extending in a second direction that is perpendicular to the first direction, and surrounding the first channel structure;

a second gate line on the substrate, extending in the second direction, and surrounding the second channel structure;

a third gate line between the first gate line and the second gate line in the first direction;

a single diffusion break (SDB) structure passing vertically through the substrate and the first fin type active area in a vertical direction, overlapping the third gate line in the vertical direction, and between the first channel structure and the second channel structure in the first direction;

a first source/drain region on the first fin type active area and between the first channel structure and the SDB structure in the first direction; and a second source/drain region on the first fin type active area and between the second channel structure and the SDB structure in the first direction; and an inter-gate insulating layer covering the first source/drain region.

13. The integrated circuit device of claim 12, wherein the first channel structure and the second channel structure each include a plurality of nano-sheets spaced apart from each other in the vertical direction.

14. The integrated circuit device of claim 12, wherein a lower surface of the SDB structure is coplanar with the second surface of the substrate, and an upper portion of the SDB structure has a tapered shape of which a horizontal width narrows away from the first surface of the substrate.

15. The integrated circuit device of claim 12, further comprising:

a gate capping layer covering the third gate line, wherein the SDB structure and the gate capping layer include silicon nitride.

16. The integrated circuit device of claim 15, wherein the SDB structure is in contact with the gate capping layer.

17. The integrated circuit device of claim 15, wherein the SDB structure is spaced apart from the gate capping layer.

18. The integrated circuit device of claim 12, further comprising:

a second fin type active area on the first surface of the substrate, extending in the first direction, and spaced apart from the first fin type active area in the second direction with an isolation layer therebetween, wherein the SDB structure does not overlap the second fin type active area in the vertical direction.

19. The integrated circuit device of claim 12, further comprising:

a second fin type active area on the first surface of the substrate, extending in the first direction, and spaced apart from the first fin type active area in the second direction with an isolation layer therebetween, wherein the SDB structure extends across the first fin type active area and the second fin type active area in the second direction.

20. An integrated circuit device comprising:

a substrate including a first surface and a second surface that are opposite to each other;

a first fin type active area extending in a first direction from the first surface of the substrate;

a first channel structure on an upper surface of the first fin type active area and including a plurality of first nano-sheets spaced apart from each other in a vertical direction;

a second channel structure on an upper surface of the first fin type active area and including a plurality of second nano-sheets spaced apart from each other in the vertical direction;

a first gate line on the substrate, extending in a second direction that is perpendicular to the first direction, and surrounding the plurality of first nano-sheets;

a second gate line on the substrate, extending in the second direction, and surrounding the plurality of second nano-sheets;

a third gate line between the first gate line and the second gate line in the first direction;

a single diffusion break (SDB) structure passing through the substrate and the first fin type active area in the vertical direction and in contact with the third gate line;

a first source/drain region on the first fin type active area and between the first channel structure and the SDB structure in the first direction;

a second source/drain region disposed on the first fin type active area and between the second channel structure and the SDB structure in the first direction; and a gate capping layer covering the SDB structure and the third gate line and including a same material as a material included in the SDB structure, wherein a lower surface of the SDB structure is coplanar with the second surface of the substrate.

* * * * *